United States Patent [19]
Murakami

[11] Patent Number: 5,689,539
[45] Date of Patent: Nov. 18, 1997

[54] TIME INTERVAL MEASUREMENT SYSTEM AND A METHOD APPLIED THEREIN

[75] Inventor: Hirokuni Murakami, Tokyo, Japan

[73] Assignee: NEC Corporation, Tokyo, Japan

[21] Appl. No.: 688,804

[22] Filed: Jul. 31, 1996

[30] Foreign Application Priority Data

Jul. 31, 1995  [JP]  Japan .................. 7-194671

[51] Int. Cl.$^6$ .................................................. G01B 7/00
[52] U.S. Cl. .................................................. 377/20
[58] Field of Search .................................. 377/20

[56] References Cited

U.S. PATENT DOCUMENTS

| | | | |
|---|---|---|---|
| 5,440,602 | 8/1995 | Gimmler et al. | 377/20 |
| 5,487,096 | 1/1996 | Pearson et al. | 377/20 |
| 5,487,097 | 1/1996 | Hatekenaka et al. | 377/20 |
| 5,579,356 | 11/1996 | Chevallier | 377/20 |

FOREIGN PATENT DOCUMENTS

2-287114  11/1990  Japan .

Primary Examiner—Margaret Rose Wambach
Attorney, Agent, or Firm—Foley & Lardner

[57] ABSTRACT

In order to measure an individual time interval with accuracy beyond frequency limit of semiconductors, a time measurement system of the invention generates a series of delayed pulses, each of which has the same pulse width with the time interval to be measured and delayed by a unit delay time shorter than a cycle time of a system clock from its preceding delayed pulse. A series of discriminate number measurement pulses are also generated from the series of delayed pulses, each of which rises at a common time and falls at each corresponding delay pulse. From number of a longest sequence of the same pulse number of the system clock counted in the discriminate number measurement pulses, the unit delay time is measured. From average value of pulse numbers of the system clock counted in each of the delayed pulses, the time interval to be measured is calculated with accuracy of the unit delay time.

4 Claims, 8 Drawing Sheets

| m-BIT-COUNTER ||| ONE-BIT-COUNTER |||
|---|---|---|---|---|---|
| Order | Output | No. | Order | Output | No. |
| 0 to $i-1$ | $C_m+1$ | $i$ | 0 to $j-1$ | $C_1+1$ | $j$ |
| $i$ to $j-1$ | $C_m$ | $j-i$ | | | |
| $j$ to $n_o-1$ | | $n_o-j$ | $j$ to $j+n_o-1$ | $C_1+2$ | $n_o$ |
| $n_o$ to $n-1$ | $C_m+1$ | | | | |
| $n$ to $i+n_o-1$ | $(C_m+1)$ | | | | |
| | | | $j+n_o$ to $2n-1$ | $C_1+3$ | $n_o$ |
| | | | $2n$ to $j+2n_o-1$ | $(C_1+3)$ | |

$\sum_0^{n_o-1}$ (bracketing first three m-BIT-COUNTER rows)

in case : $i \leq j$

FIG. 5B

| m-BIT-COUNTER | | | ONE-BIT-COUNTER | | |
|---|---|---|---|---|---|
| Order | Output | No. | Order | Output | No. |
| 0 to $j-1$ | $C_m$ | j | 0 to $j-1$ | $C_1$ | j |
| j to $i-1$ | $C_m+1$ | $i-j$ | j to $j+n_0-1$ | $C_1+1$ | $n_0$ |
| i to $n_0-1$ | $C_m$ | $n_0-i$ | | | |
| $n_0$ to $n-1$ | | | | | |
| n to $j+n_0-1$ | $(C_m)$ | | | | |
| | | | $j+n_0$ to $2n-1$ | $C_1+2$ | $n_0$ |
| | | | 2n to $j+2n_0-1$ | $(C_1+2)$ | |

$\sum_{0}^{n_0-1}$ spans rows 1–3 (0 to $n_0-1$)

in case : $j \leq i$

FIG.6 PRIOR ART

21 : AND GATE
22,23 : D-TYPE FLIP-FLOP
24 : m-BIT-COUNTER
25 : RESISTOR

27 : DIFFERENTIATOR
28 : REFERENCE NUMBER GENERATOR
29 : LATCH TIMING GENERATOR
32 : FREQUENCY VALUE CALCULATOR
33 : LATCHING UNIT

FIG. 9 PRIOR ART

35 : INPUT CIRCUIT
44 : REFERENCE NUMBER GENERATOR
45 : FREQUENCY VALUE CALCULATOR

FIG. 10 PRIOR ART

TIME INTERVAL MEASUREMENT SYSTEM AND A METHOD APPLIED THEREIN

BACKGROUND OF THE INVENTION

This invention relates to a time interval measurement system and a method applied therein, and more particularly to those which measure a time interval between two signals by counting number of clock pulses in the time interval.

Figure 6:
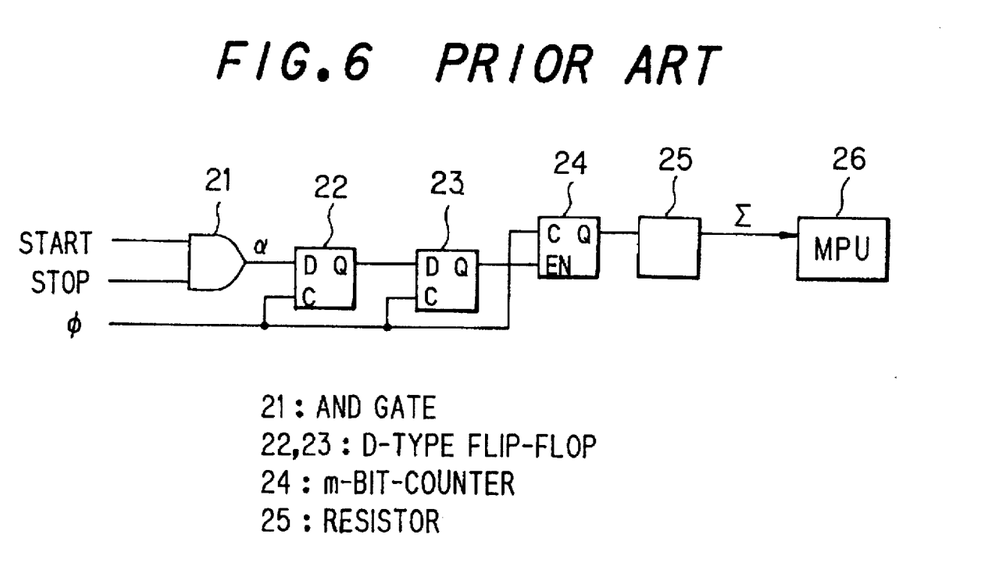
FIG. 6 is a block diagram illustrating an example of a conventional time interval measurement system.
Figure 7:
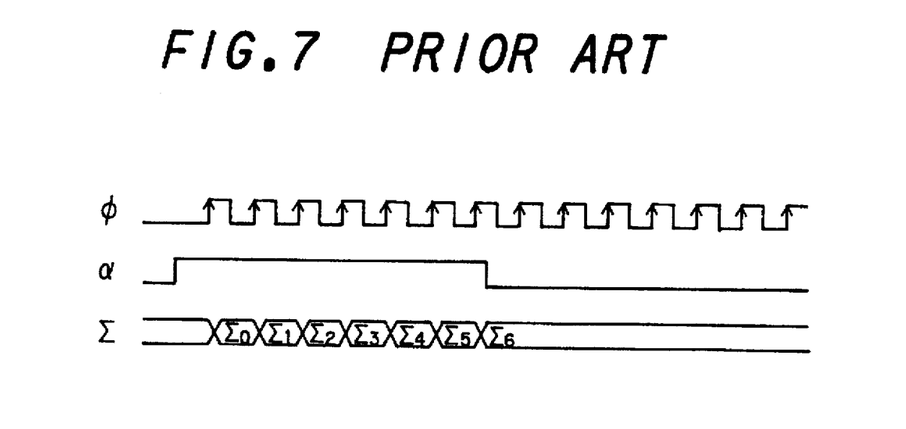
FIG. 7 is a timing-chart illustrating operation of the conventional time interval measurement system of FIG. 6.

FIG. 6 is a block diagram illustrating an example of a conventional time interval measurement system, wherein are comprised an AND gate 21, D-type flip-flops 22 and 23, an m-bit-counter 24 (m being an integer indicating output bit-width of the counter), a register 25 and a Micro Processor Unit (hereafter abbreviated as an MPU). FIG. 7 is a timing-chart illustrating operation of the conventional time interval measurement system.

Referring to FIG. 6 and FIG. 7, a logical product α of a START signal rising at a start point and a STOP signal falling at a stop point is obtained by the AND gate 21 to be supplied to D (data) terminal of the D-type flip-flop 22, while a system clock φ is supplied to each C (clock) terminal of the D-type flip-flops 22 and 23 constituting a shift register controlled by the system clock φ.

Enabled with the output of the shift register having a pulse width corresponding to that of the output logic α and delivered to EN (enable) terminal of the m-bit-counter 25, the m-bit-counter 25 counts up number of pulses of the system clock φ and outputs a signal Σ composed of sequences of m bits ($\Sigma_0, \Sigma_1, \ldots$ of FIG. 7), each of the bit sequences indicating the number of pulses counted until each present time and stored in the register 25 each by each.

From the counted value maintained in the register 25 at the end of the signal φ, the MPU 26 calculates the time interval to be measured by multiplying with a cycle time of the system clock φ.

Figure 8:
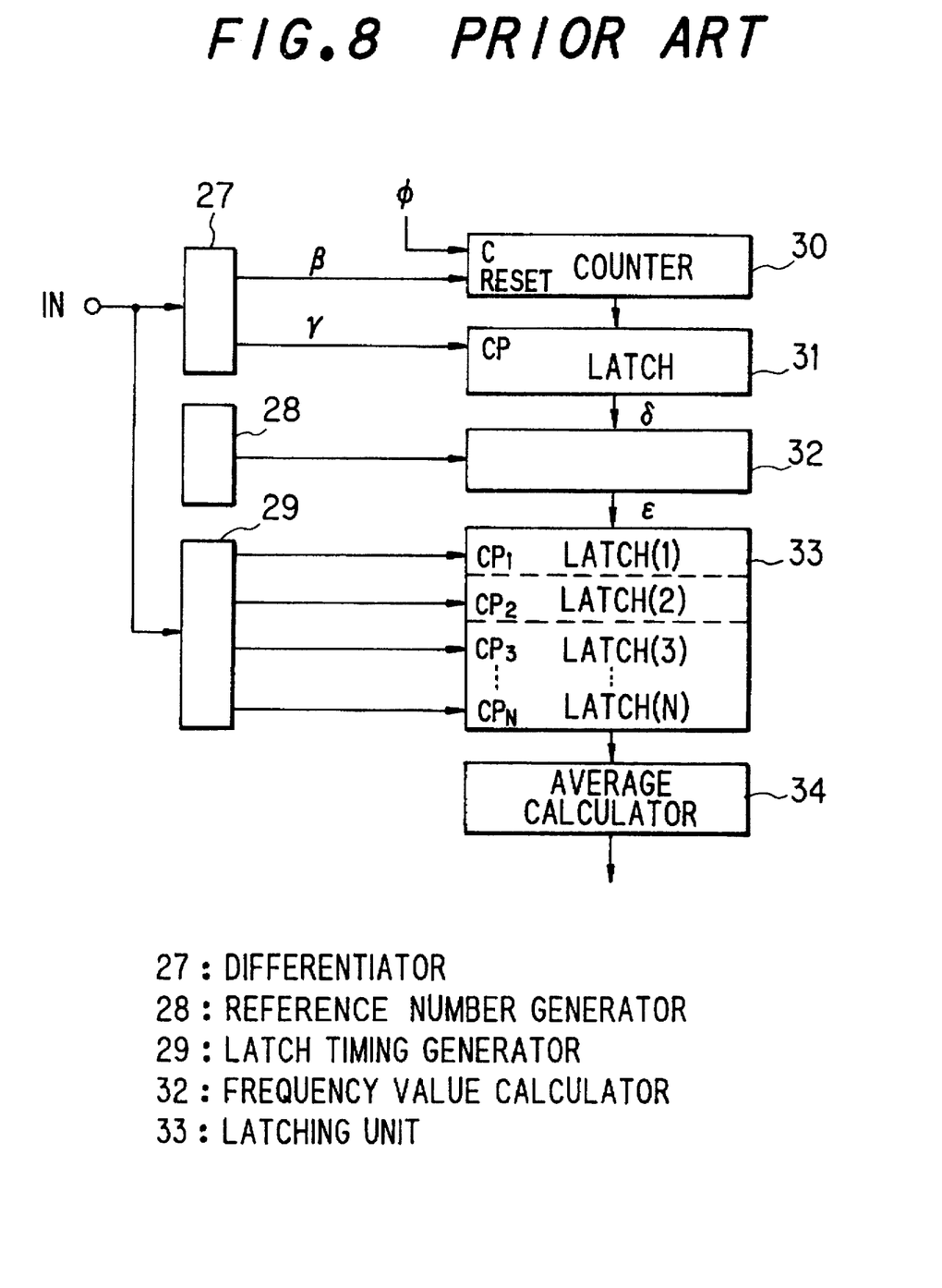
FIG. 8 is a block diagram illustrating another example of a time interval measurement system.

FIG. 8 is a block diagram illustrating another example of a time interval measurement system disclosed in a Japanese patent application laid open as a Provisional Publication No. 287114/'90, wherein is obtained an average value of time intervals between rising edges of a pulse signal.

The time interval measurement system of the prior art of FIG. 8 comprises a differentiator 27 supplied with an input pulse signal IN to be measured, a reference number generator 28, a latch timing generator 29 for generating n latch timings from the input pulse signal IN, a counter 30, a latch 31, a frequency value calculator 32, a latching unit 33 composed of n latches controlled by the n latch timings, and is an average calculator 34.

The differentiator 27 differentiates the input pulse signal IN and generates a signal β to be input to RESET terminal of the counter 30 with a narrow pulse generated a little delayed from every rising edge of the input pulse signal IN, and a signal γ to be input to CP (capture) terminal of the latch 31 with a narrow pulse generated at every rising edge of the input pulse signal IN.

The counter 30 counts up number of pulses of a system clock φ supplied to its C terminal, which is reset by the signal β just after latched by the latch 31 controlled with the signal γ at every rising edge of the input pulse signal IN. From the latched data δ, the frequency value calculator 32 calculates data indicating a frequency value ε according to an equation ε=(the reference number generated by the reference number generator 28)/δ.

Every i-th of consecutive n data sets of the frequency value ε is captured by i-th of s latches of the latching unit 33 controlled with i-th of the n latch timings generated by the latch timing generator 29. Thus, the average calculator 34 can calculate an average frequency value $\epsilon_{av}$ at any time by dividing sum of the n sets of latched data in the latching unit 33 by n.

Figure 9:
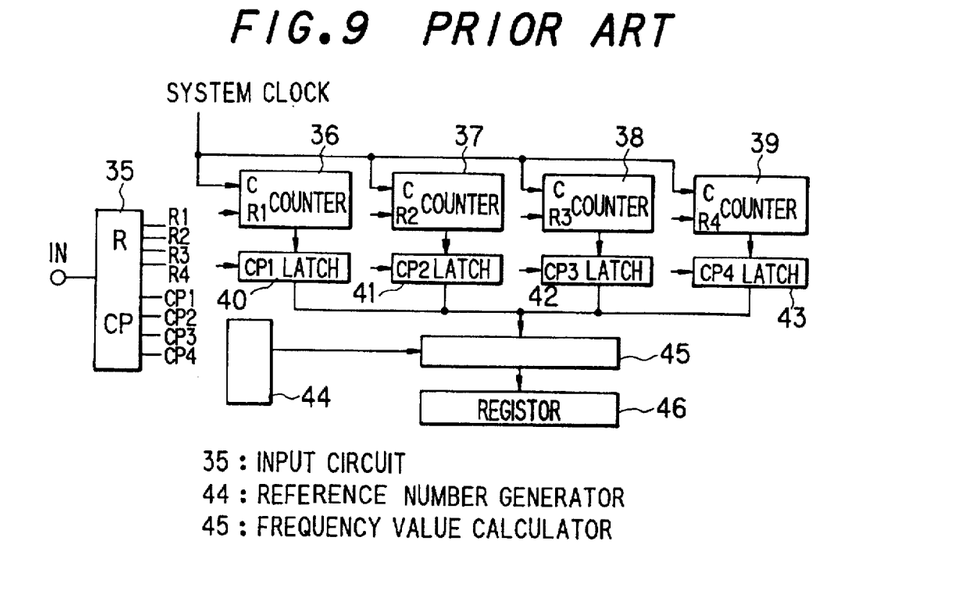
FIG. 9 is a block diagram showing still another prior art for time interval measurement.
Figure 10:
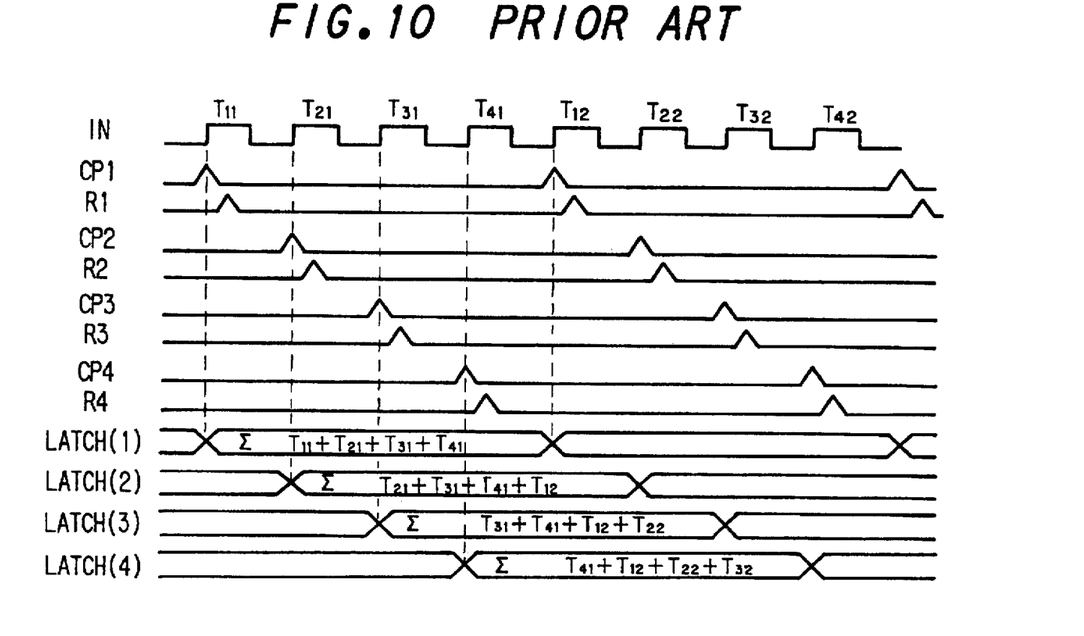
FIG. 10 is a timing chart illustrating operation of the prior art of FIG. 9.

FIG. 9 is a block diagram showing still another prior art for time interval measurement, of which operation is illustrated in a timing chart of FIG. 10.

The time interval measurement system of FIG. 9 comprises an input circuit 35 for generating reset pulses R1, R2, R3 and R4 and latch timings CP1, CP2, CP3 and CP4 synchronized with rising edges of an input pulse signal IN supplied thereto to be measured, counters 36, 37, 38 and 39 each of which is reset by each of the reset pulses R1, R2, R3 and R4 respectively and counts up number of pulses of a system clock φ commonly supplied to their C terminals, latches 40, 41, 42 and 43 each of which latches each output of the counters 36, 37, 38 and 39 controlled with each of the latch timings CP1, CP2, CP3 and CP4 respectively, a reference number generator 44, a frequency value calculator 45, and a register 46.

Similarly to the prior art of FIG. 8, each of the reset pulses R1, R2, R3 and R4 being generated following just after each of the latch timings CP1, CP2, CP3 and CP4 generated at every fourth rising edge of the input pulse signal IN respectively, each of the latches 40, 41, 42 and 43 latches output of each of the counters 36, 37, 38 and 39 indicating pulse number of the system clock φ in each period between every fourth rising edges of the input pulse signal IN beginning by one cycle difference of the input pulse signal IN with each other as shown in FIG. 10.

Latched data in the latches 40, 41, 42 and 43 are read out by the frequency value calculator 45 for obtaining sum of them, with which reference number generated by the reference number generator 44 is divided for obtaining an average frequency value to be registered in the register 46 as the output data.

As heretofore described, in the prior arts of FIG. 6, FIG. 8 and FIG. 9, measurement accuracy of them is all dependent on a cycle time of the system clock φ, which has a minimum limit restricted by manufacturing processes of semiconductors used for generating the system clock φ. When the system clock φ is obtained by a frequency multiplier or a ring oscillator, it is the same thing that the minimum cycle time is restricted by the manufacturing processes of semiconductors used therein. This means that the measurement accuracy is restricted by frequency limit of semiconductors concerned.

For the reason, in the prior arts of FIG. 8 and FIG. 9, an average value of certain time intervals is calculated for improving the measurement accuracy. When n time intervals have the same time width, the measurement accuracy can be improved n times, that is a difference of 1/n can be discriminated, by counting and taking an average of pulse numbers of the system clock arising asynchronously in the time intervals. However, this average calculation method for improving measurement accuracy can not be applied for measuring an individual time interval or irregular time intervals.

Furthermore, as for counters used for counting pulse numbers in the prior arts of FIG. 6, FIG. 8 and FIG. 9, there is a problem of input racing, that is, when a clock pulse is delivered racing with a beginning or an ending of a time interval, it is undetermined whether the clock pulse is counted or omitted. For the reason, a shift register composed of two D-type flip-flops 22 and 23 is provided in the prior art of FIG. 6. However, also as for the D-type flip-flop 22, there may occur the input racing when two input signals α and φ race critically with each other. Therefore, counted numbers may fluctuate by ±1.

SUMMARY OF THE INVENTION

Therefore, a primary object of the invention is to provide a time interval measurement system which can measure even an individual time interval with accuracy beyond the frequency limit of semiconductor devices, suppressing effect of the input racing at the same time.

In order to achieve the object, a time interval measurement system of the invention comprises:

means for generating a measurement pulse having a pulse width of a time interval to be measured;

means for generating a series of delayed pulses, a first of said series of delayed pulses being said measurement pulse, each (k+1)-th of said series of delayed pulses having a same pulse width with said measurement pulse and being delayed by a unit delay time from k-th of said series of delayed pulses, and last of said series of delayed pulse being delayed from said measurement pulse more than two cycle of a system clock, k being a positive integer;

means for reforming each of said series of delayed pulses into a series of quantized pulses, each k-th of said series of quantized pulses being synchronized with said system clock and having a width of a pulse rising at a first rising edge of said system clock following a rising edge of k-th of said series of delayed pulses and falling at a first rising edge of said system clock following a falling edge of said k-th of said series of delayed pulses;

means for generating a series of discriminate number measurement pulses, each k-th of said series of discriminate number measurement pulses rising at a common time and falling at a falling edge of k-th of said series of delayed pulses;

a series of one-bit-counters, each k-th of said series of one-bit-counters counting a number of rising edges of said system clock during a period enabled with k-th of said series of discriminate number measurement pulses;

a series of multi-bit counters having a bit width sufficient for counting rising edges of said system clock during said time interval to be measured, each k-th of said series of multi-bit counters counting a number of rising edges of said system clock during a period enabled with k-th of a first half of said series of quantized pulses; and control means for detecting a longest sequence of a same logic of outputs of said series of one-bit-counters and determining a discriminate number as a number of one-bit-counters outputting said longest sequence of a same logic, controlling addition means to accumulate and output a total number of outputs of a first sequence of said discriminate number of said series of multi-bit counters, and calculating said time interval to be measured by dividing said total number by said discriminate number and multiplying by a cycle time of said system clock.

Therefore, the time interval measurement system of the invention can measure even an individual time interval with accuracy of the unit delay time beyond the frequency limit of semiconductor devices used therein, without any deflection caused by temperature variation or instability of power supply by measuring the unit delay time always at the same time in the same circumstances with the time interval to be measured, and further, by taking average value of outputs of a number of sets of counters, the effect of the input racing can be also suppressed.

BRIEF DESCRIPTION OF THE DRAWINGS

The foregoing, further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Now, embodiments of the present invention will be described in connection with the drawings.

Figure 1:
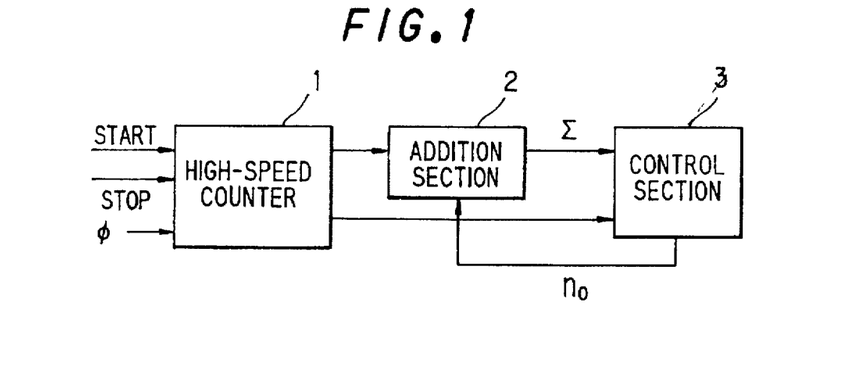
FIG. 1 is a block diagram showing basic composition of time interval measurement system of the invention.

FIG. 1 is a block diagram showing basic composition of time interval measurement system of the invention, having a high-speed counter 1, an addition section 2 and a control section 3.

Figure 2:
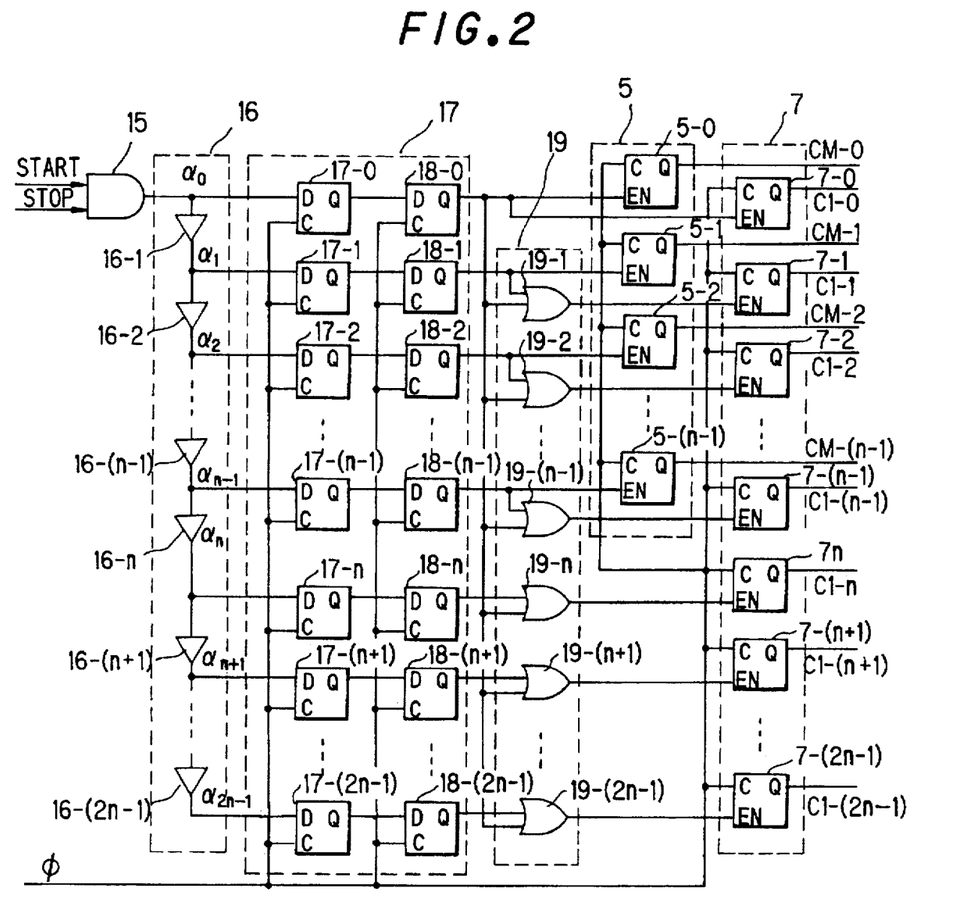
FIG. 2 is a block diagram illustrating a configuration of an embodiment of high-speed counter 1 of FIG. 1.

A configuration of the high-speed counter 1 is illustrated in FIG. 2, which comprises an AND gate 15 for generating a pulse signal $\alpha_0$ having a pulse width of time interval to be measured, a cascade connection 16 of delay buffers 16-1, 16-2, . . . , 16-(2n-1) for generating delayed pulses $\alpha_1, \alpha_2, \ldots, \alpha_{2n-1}$ by delaying the pulse signal $\alpha_0$, a shift register unit 17 composed of D-type flip-flops 17-0 and 18-0, 17-1 and 18-1, 17-2 and 18-2, . . . , 17-(2n-1) and 18-(2n-1) controlhal by a system clock φ for quantizing pulse widths of the pulse signal and the delayed pulses $\alpha_1, \alpha_2, \ldots, \alpha_{2n-1}$ respectively, an m-bit-counter unit 5 having n sets of m-bit-counters 5-0, 5-1, . . . , 5-(n-1) enabled by outputs of the D-type flip-flops 18-0, 18-1, . . . , 18-(n-1) respectively for counting number of pulses of the system clock φ, an OR gate unit 19 having OR gates 19-1, 19-2, . . . , 19-(2n-1) for obtaining OR logic of the output of the D-type flip-flop 18-0 and the outputs of the D-type flip-flops 18-1, . . . , 18-(2n-1) respectively, and a one-bit-counter unit 7 having 2n sets of one-bit-counters 7-0, 7-1, . . . , 7-(2n-1) enabled by the outputs of the D-type flip-flop 18-0 and the OR gates 19-1, 19-2, . . . , 19-(2n-1) respectively for counting number of pulses of the system clock $\phi$.

Figure 3:
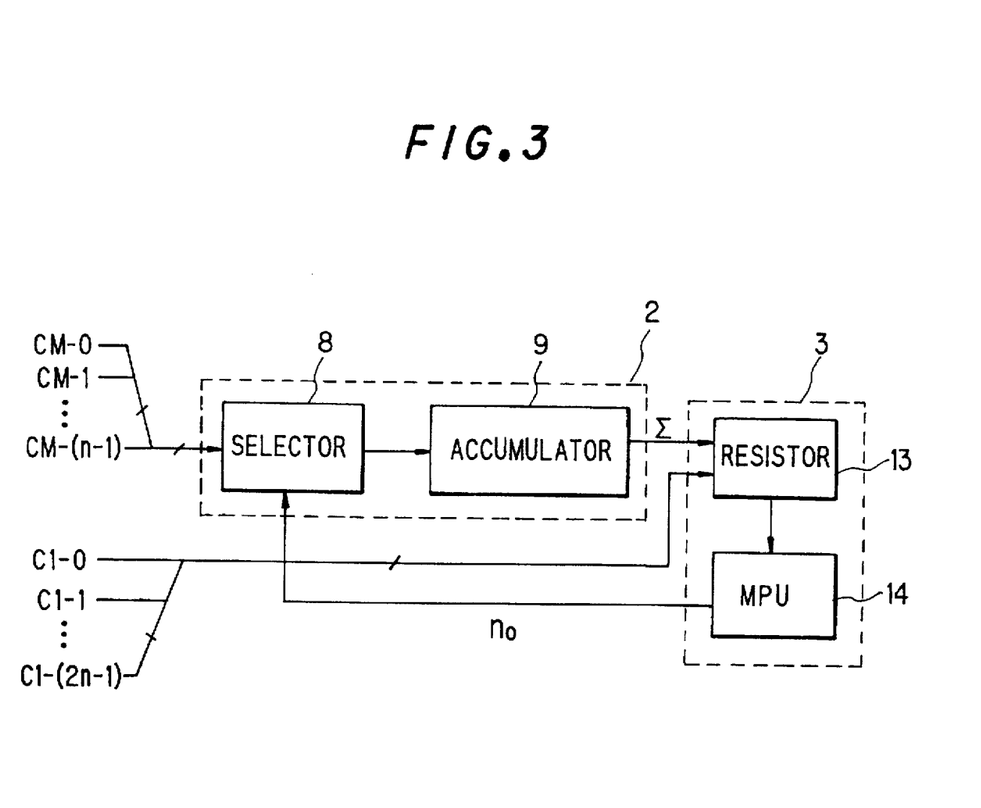
FIG. 3 is a block diagram illustrating a configuration of the addition section and the control section 3 of FIG. 1.

A configuration of the addition section 2 and the control section 3 is shown in FIG. 3.

As shown in FIG. 3, outputs CM-0, CM-1, . . . , CM-(n-1) of the n sets of m-bit-counters 5-0 to 5-(n-1) are connected to a selector 8 constituting the addition section 2 together with an accumulator 9, while outputs C1-0, C1-1, . . . , C1-(2n-1) of the one-bit-counters 7-0 to 7-(2n-1) are supplied to a register 13 of the control section 3.

Figure 4:
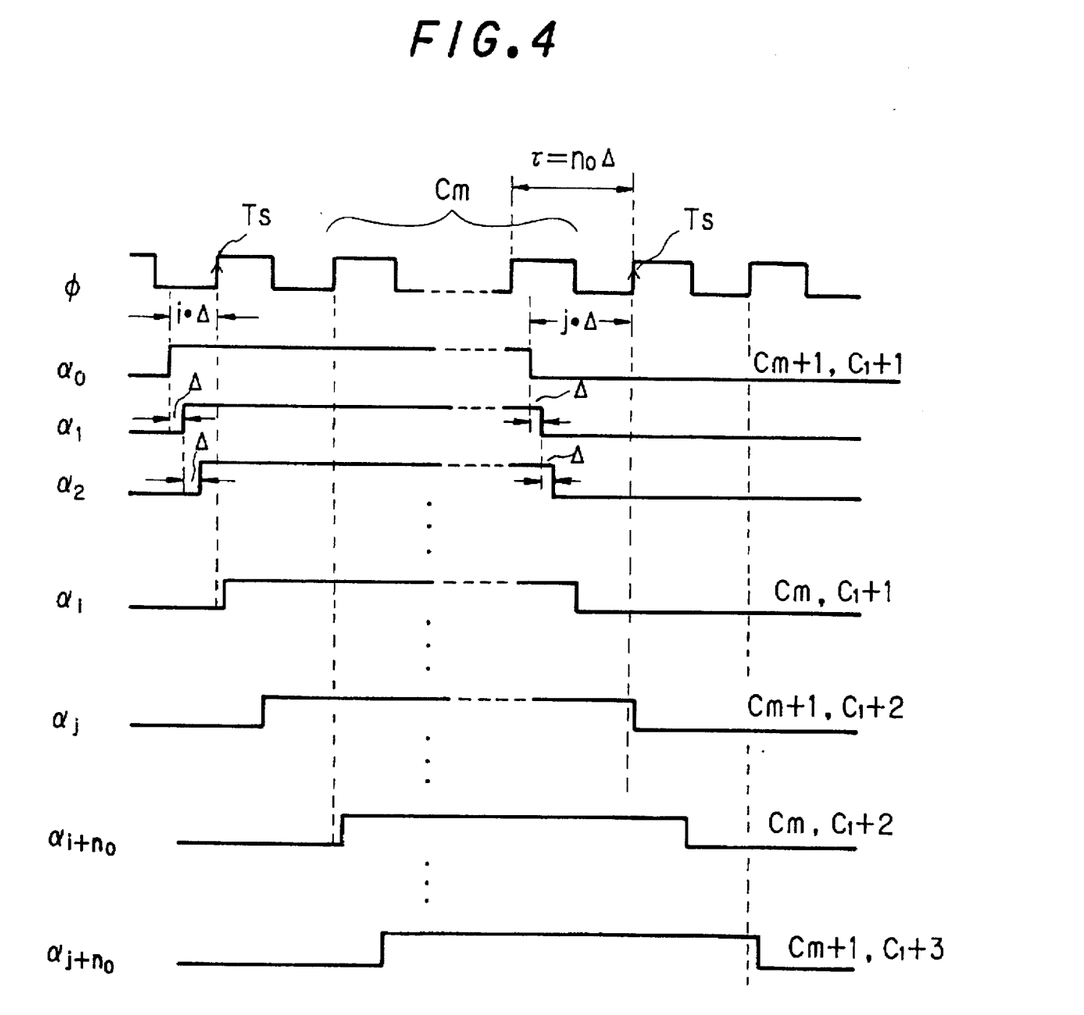
FIG. 4 is a timing chart for illustrating operation of the high-speed counter of FIG. 2.
Figure 5A:
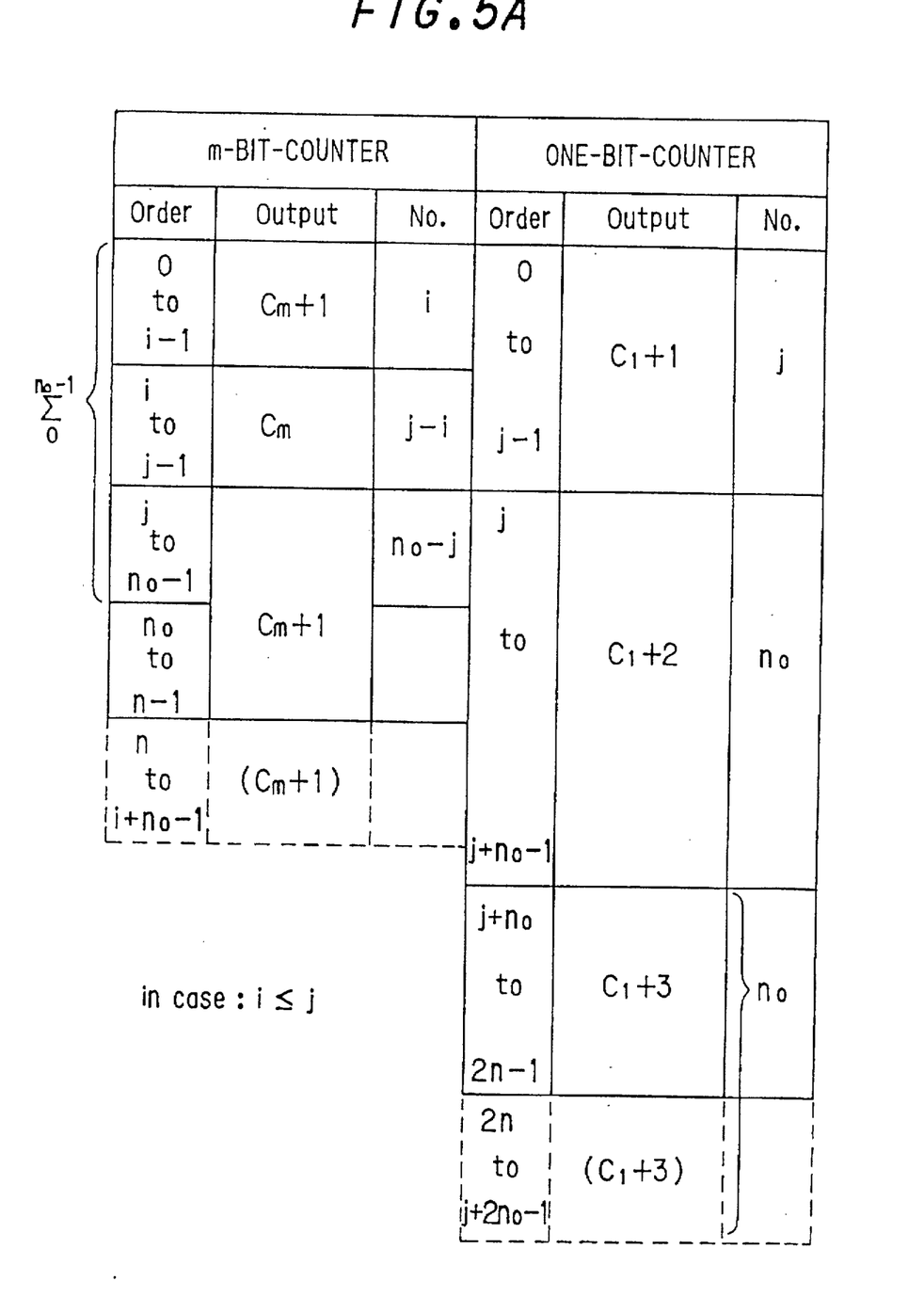
FIG. 5A is a table showing an example of outputs of counters in the high-speed counter of FIG. 2.
Figure 5B:
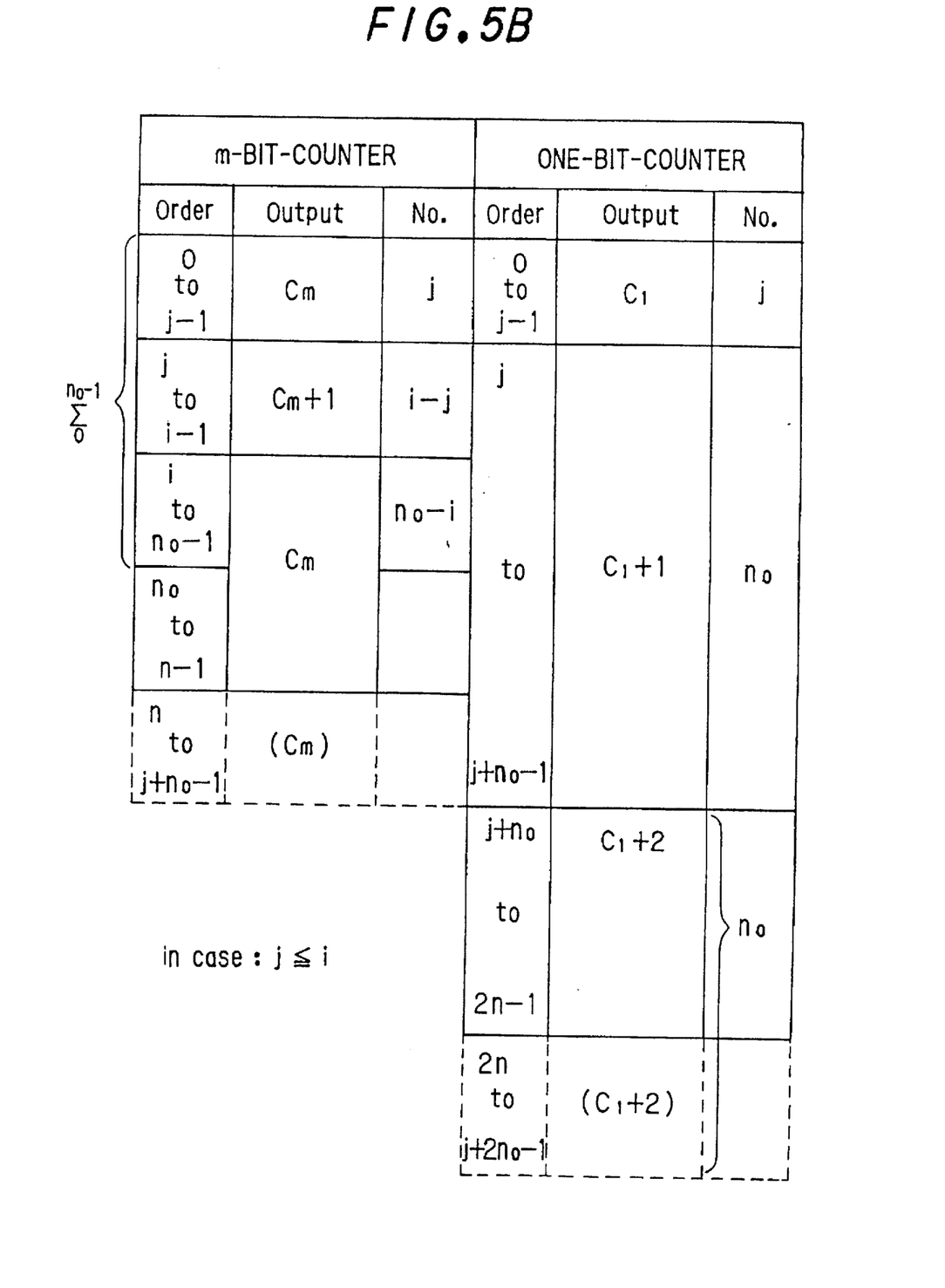
FIG. 5B is a table showing another example of outputs of counters in the high-speed counter of FIG. 2.

FIG. 4 is a timing chart and FIG. 5A and FIG. 5B are tables illustrating operation of the high-speed counter 1.

Now, referring to FIG. 1 to FIGS. 5A and 5B, operation of an embodiment of the invention will be described.

Suppose that a START signal and a STOP signal are supplied to the AND gate 15 of FIG. 2 and a pulse signal $\alpha_0$ as shown in FIG. 4 is generated having a pulse rising about $i\Delta$ advanced from next rising edge $T_S$ of the system clock $\phi$ and falling about $j\Delta$ advanced from next rising edge $T_E$ of the system clock $\phi$, where $\Delta$ denotes a unit delay of each of the delay buffers 16-1, 16-2, . . . , 16-2n, and a cycle time $\tau$ of the system clock is expressed as $\tau$~$n_0\Delta$, i, j and a discriminate number no being integers in a relation $0 \leq i \leq j \leq n_0$.

The pulse signal $\alpha_0$ is quantized by the D-type flip-flops 17-0 and 18-0 into a pulse having a pulse width between the rising edges $T_S$ and $T_E$ and counted by the first m-bit-counter 5-0 as Cm+1, for example.

The first delay buffer 16-1 delays the pulse signal $\alpha_0$ by $\Delta$ and generates a first aelayed pulse $\alpha_1$, which is quantized and counted by the second m-bit-counter 5-1 as also Cm+1. Similarly, until the (i-1)-th m-bit-counter 5-(i-1), every of the counted numbers indicates the same value Cm+1.

As for the i-th m-bit-counter 5-i, it counts the pulse width of the i-th delayed pulse $\alpha_i$ as Cm, because it rises after the rising edge $T_S$. Thus, every of (j-i) m-bit-counters from 5-i to 5-(j-1) indicates Cm, while every of m-bit-counters 5-j, . . . indicates again Cm+1 by counting delayed pulses $\alpha_j$, . . . falling after the rising edge $T_E$, as shown in the table of FIG. 5A.

Therefore, the pulse width of the pulse signal $\alpha_0$, that is, the time interval to be measured can be obtained by taking average (multiplied by $\tau$) of outputs of the first no m-bit-counters 5-0 to 5-($n_0$-1) as equation (1).

$$\frac{1}{n_0} \sum_{k=0}^{n_0-1} CM-k = \frac{1}{n_0} \{i(Cm+1)+(j-i)Cm+(n_0-j)(Cm+1)\} \quad (1)$$

$$= Cm + \left(1 - \frac{j-i}{n_0}\right)$$

Here, it is to be noted that the unit delay $\Delta$ of the delay buffers, and consequently, the discriminate number $n_0$, that is the number of m-bit-counters to be selected for taking the average value, may always vary affected by measuring circumstances as temperature, power supply voltage, etc. Therefore, the discriminate number no must be counted at the same time in the same circumstances with the m-bit-counters.

For the purpose, the 2n sets of one-bit-counters 7-0 to 7-(2n-1) are provided in the high-speed counter of FIG. 2.

Each k-th one-bit-counter 7-k counts the system clock $\phi$, enabled by OR logic of the outputs of D-type flip-flops 18-0 and 18-k, which has a pulse width corresponding to that between the rising edge $T_S$ and the first rising edge of the system clock $\phi$ following the failing edge of the corresponding delayed pulse $\alpha_k$.

So, taking example of FIG. 4, when the first one-bit-counter 7-0 counts as $C_1$+1, which is 0 or 1, every of the first j one-bit-counters 7-0 to 7-(j-1) indicate the same number $C_1$+1, and following $n_0$ one-bit-counters 7-j to 7-(j+$n_0$-1) indicate $C_1$+2=$C_1$, which are to be followed by another sequence of $n_0$ one-bit-counters 7-(j+$n_0$) to 7-(j+2$n_0$-1) indicating $C_1$+3=$C_1$+1, as shown in FIG. 5A.

Thus, the discriminate number $n_0$, that is the number of m-bit-counters to be selected for taldng the average value, can be obtained by counting number of a longest sequence of the same logic 1 or 0 (HIGH or LOW) in the outputs of the 2n one-bit-counters 7-0 to 7-(2n-1), on condition that the number 2n of the one-bit-counters is designed more than $2\tau/\Delta_{min} \geq \tau/\Delta_{min}+j$, $\Delta_{min}$ being minimum possible value of the unit delay $\Delta$ of the delay buffers.

Here, in the embodiment, the one-bit-counters are enabled by pulses all rising at a rising edge of output of the D-type flip-flop 18-0. However, they may be rise up at any time before falling edge of the output of the D-type flip-flop 18-0, on condition they all rise up at the same time.

In order to obtain the discriminate number n0, outputs C1-0 to C1-(2n-1) of the 2n one-bit-counters 7-0 to 7-(2n-1) are delivered to the registor 13 of the control unit 3 as shown in FIG. 3 in the embodiment. The MPU 14 counts number n0 of the longest sequence of the same logic of them and controls the selector 8 to select first $n_0$ outputs CM-0 to CM-($n_0$-1) of the m-bit-counters 5-0 to 5-($n_0$-1). The selected outputs CM-0 to CM-($n_0$-1) are accumulated in the accumulator 9 and registered in the register 13.

Thus, the time interval to be measured can be calculated by the MPU 14 according to the equation (1).

Heretofore, the operation of the embodiment is described referring to the example illustrated in FIG. 4 on condition $0 \leq i \leq j \leq n_0$. In case $0 \leq j \leq i \leq n_0$, the outputs of the m-bit-counters and the one-bit-counters become as shown in FIG. 5B and give the time interval to be measured expressed by following equation (2) in the same way. So, duplicated descriptions are omitted.

$$\frac{1}{n_0} \sum_{k=0}^{n_0-1} CM-k = \frac{1}{n_0} \{jCm+(i-j)(Cm+1)+(n_0-i)Cm\} \quad (2)$$

$$= Cm + \frac{i-j}{n_0}$$

In this way, the time measurement system of the embodiment of FIG. 1 can measure even an individual time interval with accuracy of the unit delay $\Delta$ beyond the frequency limit (1/$\tau$) of semiconductor devices used therein, without any deflection caused by temperature variation or instability of power supply by measuring the unit delay $\Delta$ always at the same time in the same circumstances with the time interval to be measured, and further, by taldng average value of outputs of $n_0$ sets of m-bit-counters, the effect of the input racing can be also suppressed by 1/$n_0$.

In the embodiment above described, the high-speed counter 1 is provided with n sets of m-bit-counters. However, the outputs of the m-bit-counters are logically either Cm or Cm+1, Cm being integer part of the average value to be calculated. Therefore, it is sufficient logically with one m-bit-counter and (n-1) sets of one-bit-counters to obtain an average of values of Cm and Cm+1, if up-placing or overflowing of figures in the one-bit-counters is discriminated in some way.

However, if the integer part of the average value is determined with only one m-bit-counter, deviation caused by the input racing can not be detected. So, some means are needed.

In another embodiment of the present invention, the high-speed counter 1 of FIG. 1 is provided with at least three (three, for example) m-bit-counters in order to obtain the integer part Cm of the equation (1) or (2) omitting effect of the input racing, and other (n-3, for the example) m-bit-counters provided in the first embodiment of FIG. 4 are replaced with the same number of two-bit-counters for obtaining fractional value $1-(j-i)/n_0$ of the equation (1) or $(i-j)/n_0$ of the equation (2) discriminating overflow from the lowest bit.

In the second embodiment, the MPU 14 controls the selector 8 to select outputs of the three m-bit-counters to be accumulated in the accumulator 9 in order for the first, and an average value Cm' of them is stored in the registot 13. Then tke MPU 14 obtains the discriminate number $n_0$ in the same way as the first embodiment and controls the selector 8 to select a sequence of first $n_0$ outputs in order of the n-3 two-bit-counters together with lower two bits of outputs of the three m-bit-counters.

Then, in the second embodiment, residue Cmr of Cm'/4 is calculated by the MPU 14.

When value of lower two bits of the integer part Cm of the average value to be calculated is 1, for example, the residue Cmr is to be between 1 to 2 without effect of the input racing. If the input racing of ±1 is sufficient to be considered for only one m-bit-counter, the value of the residue Cmr is to be limited between 2/3 to 7/3. Similarly, when the lower two bits of the integer part Cm is 2, 3 or 0, the residue is to be limited between 5/3 to 10/3, 8/3 to 4 and 0 to 1/3 or 11/3 to 4 and 0 to 4/3, respectively, in case three m-bit-counters are provided.

When effect of the input racing must be considered for several (R) consecutive counters, the three m-bit-counters are better to be provided separately, or by designing the number (N) of m-bit-counters more than 2R, the value of the residue can be limitted between more than Cm–½ to less than Cm+3/2.

Conversely, it can be said that when the residue Cmr is ½ to 3/2, 3/2 to 5/2, 5/2 to 7/2 or 7/2 to (7/2 to 4 and 0 to 1/2), the lower two bit of the integer part Cm is either 0 or 1, 1 or 2, 2 or 3, or 3 or 0, respectively. And consequently, each output of the two-bitcounters is one of 0, 1 and 2, one of 1, 2 and 3, one of 2, 3 and 0, or one of 3, 0, 1 respectively.

Therefore, in the embodiment, the first $n_0$ outputs of the two-bit-counters are directly accumulated in the accumulator 9 when the residue Cmr is 1/2 to 5/2, while otherwise, each of them is accumulated in the accumulator 9 after added by 2 for omitting effect of up-placing or overflowing of figures.

The result of the accumulator 9 is registered in the registor 13 to be divided by $n_0$ in the same way of the first embodiment. The time interval to be measured is obtained from value of bits higher than two of the average Cm' of outputs of the m-bit-counters added with value of bits lower than three including fractional part of the average of outputs of the two-bit-counters subtracted by 2 when the residue Cmr is smaller than 1/2 or larger than 5/2.

Thus, in the second embodiment, a time interval can be measured with as sufficient accuracy as in the first embodiment with fewer elements than the first embodiment.

What is claimed is:

1. A time interval measurement system comprising:

means for generating a measurement pulse having a pulse width of a time interval to be measured;

means for generating a series of delayed pulses, a first of said series of delayed pulses being said measurement pulse, each (k+1)-th of said series of delayed pulses having a same pulse width with said measurement pulse and being delayed by a unit delay time from k-th of said series of delayed pulses, and last of said series of delayed pulses being delayed from said measurement pulse more than two cycles of a system clock, k being a positive integer;

means for reforming each of said series of delayed pulses into a series of quantized pulses, each k-th of said series of quantized pulses being synchronized with said system clock and having a width of a pulse rising at a first rising edge of said system clock following a rising edge of k-th of said series of delayed pulses and falling at a first rising edge of said system clock following a falling edge of said k-th of said series of delayed pulses;

means for generating a series of discriminate number measurement pulses, each k-th of said series of discriminate number measurement pulses rising at a common time and falling at a falling edge of k-th of said series of delayed pulses;

a series of one-bit-counters, each k-th of said series of one-bit-counters counting a number of rising edges of said system clock during a period enabled with k-th of said series of discriminate number measurement pulses;

series of multi-bit counters having a bit width sufficient for counting rising edges of said system clock during said time interval to be measured, each k-th of said series of multi-bit counters counting a number of rising edges of said system clock during a period enabled with k-th of a first half of said series of quantized pulses; and control means for detecting a longest sequence of a same logic of outputs of said series of one-bit-counters and determining a discriminate number as a number of one-bit-counters outputting said longest sequence of a same logic, controlling addition means to accumulate and output a total number of outputs of a first sequence of said discriminate number of said series of multi-bit counters, and calculating said time interval to be measured by dividing said total number by said discriminate number and multiplying by a cycle time of said system clock.

2. A time interval measurement system comprising:

means for generating a measurement pulse having a pulse width of a time interval to be measured;

means for generating a series of delayed pulses, a first of said series of delayed pulses being said measurement pulse, each (k+1)-th of said series of delayed pulses having a same pulse width with said measurement pulse and being delayed by a unit delay time from k-th of said series of delayed pulses, and last of said series of delayed pulses being delayed from said measurement pulse more than two cycles of a system clock, k being a positive integer;

means for reforming each of said series of delayed pulses into a series of quantized pulses, each k-th of said series of quantized pulses being synchronized with said system clock and having a width of a pulse rising at a first rising edge of said system clock following a rising edge of k-th of said series of delayed pulses and falling at a first rising edge of said system clock following a falling edge of said k-th of said series of delayed pulses;

means for generating a series of discriminate number measurement pulses, each k-th of said series of discriminate number measurement pulses rising at a time common for every of said series of discriminate number measurement pulses and falling at a falling edge of k-th of said series of delayed pulses;

a series of one-bit-counters, each k-th of said series of one-bit-counters counting a number of rising edges of said system clock during a period enabled with k-th of said series of discriminate number measurement pulses;

a series of multi-bit counters, at least three of said series of multi-bit counters having a bit width sufficient for counting rising edges of said system clock during said time interval to be measured and the others of said series of multi-bit counters having a bit width of two, each k-th of said series of multi-bit counters counting a number of rising edges of said system clock during a period enabled with k-th of a first half of said series of quantized pulses; and control means for detecting a longest sequence of a same logic of outputs of said series of one-bit-counters and determining a discriminate number as a number of one-bit-counters outputting said longest sequence of a same logic, controlling addition means to accumulate and output a first total number of outputs of said at least three of said series of multi-bit counters for obtaining an average value of said outputs of said at least three of said multi-bit counters and to accumulate and output a second total number of outputs of a first sequence of said discriminate number of said series of multi-bit counters including lower two bits of said at least three adding to each of said outputs of a first sequence of said discriminate number with a compensate number according to a value of a residue of said average value divided by four for compensating over flowed figures therefrom, and calculating said time interval to be measured by multiplying a cycle time of said system clock by a sum of a binary value of bits higher than two of said average value and said second total number divided by said discriminate number and subtracted with said compensate number.

3. A method of time interval measurement comprising steps of:

generating a measurement pulse having a pulse width of a time interval to be measured;

generating a series of delayed pulses, a first of said series of delayed pulses being said measurement pulse, each (k+1)-th of said series of delayed pulses having a same pulse width with said measurement pulse and being delayed by a unit delay time from k-th of said series of delayed pulses, and last of said series of delayed pulses being delayed from said measurement pulse more than two cycles of a system clock, k being a positive integer;

reforming each of said series of delayed pulses into a series of quantized pulses, each k-th of said series of quantized pulses being synchronized with said system do& and having a width of a pulse rising at a first rising edge of said system clock following a rising edge of k-th of said series of delayed pulses and falling at a first rising edge of said system clock following a falling edge of said k-th of said series of delayed pulses;

generating a series of discriminate number measurement pulses, each k-th of said series of discriminate number measurement pulses rising at a common time and falling at a falling edge of k-th of said series of delayed pulses;

outputting a series of one bit values, each k-th of said one bit values indicating odd or even of a number of rising edges of said system clock during a period at a high level of k-th of said series of discriminate number measurement pulses;

determining a discriminating number as a number of one bit values of a longest sequence of a same value of said series of one bit values;

obtaining an average value of a series of multi-bit values, each k-th of said series of multi-bit values indicating a number of rising edges of said system clock during a period at a high level of k-th of a first sequence of said discriminate number of said series of quantized pulses; and calculating said time interval to be measured by multiplying said average value by a cycle time of said system clock.

4. A method of time interval measurement comprising steps of:

generating a measurement pulse having a pulse width of a time interval to be measured;

generating a series of delayed pulses, a first of said series of delayed pulses being said measurement pulse, each (k+1)-th of said series of delayed pulses having a same pulse width with said measurement pulse and being delayed by a unit delay time from k-th of said series of delayed pulses, and last of said series of delayed pulses being delayed from said measurement pulse more than two cycles of a system clock, k being a positive integer;

reforming each of said series of delayed pulses into a series of quantized pulses, each k-th of said series of quantized pulses being synchronized with said system clock and having a width of a pulse rising at a first rising edge of said system clock following a rising edge of k-th of said series of delayed pulses and falling at a first rising edge of said system clock following a falling edge of said k-th of said series of delayed pulses;

generating a series of discriminate number measurement pulses, each k-th of said series of discriminate number measurement pulses rising at a common time and falling at a falling edge of k-th of said series of delayed pulses;

outputting a series of one bit values, each k-th of said one bit values indicating odd or even of a number of rising edges of said system clock during a period of a high level of k-th of said series of discriminate number measurement pulses;

determining a discriminating number as a number of one bit values of a longest sequence of a same value of said series of one bit values;

obtaining a first average value of at least three of multi-bit values, each of said at least three of multi-bit values indicating a number of rising edges of said system clock during a period of a high level of each of at least three of a first sequence of said discriminate number of said series of quantized pulses;

calculating a residue of said first average value divided by four;

obtaining a second average value of a series of binary values of two bits, each of said series of binary values of two bits indicating a value of lower two bits of a number of rising edges of said system clock during a period of a high level of each of said first sequence of said discriminate number of said series of quantized pulses added with a compensate number according to value of said residue for compensating overflowed figures from said lower two bits; and calculating said time interval to be measured by multiplying a cycle time of said system clock by a sum of a binary value of bits higher than two of said first average value and said second average value subtracted with said compensate number.

* * * * *